United States Patent [19]

Gomi

[11] Patent Number: 4,727,334
[45] Date of Patent: Feb. 23, 1988

[54] VOLTAGE-CONTROLLED CIRCUIT
[75] Inventor: Hiroshi Gomi, Kumagaya, Japan
[73] Assignee: Kabushiki Kaisha Toshiba, Kawasaki, Japan
[21] Appl. No.: 839,080
[22] Filed: Mar. 12, 1986
[30] Foreign Application Priority Data Mar. 15, 1985 [JP] Japan .................................. 60-50330

[51] Int. Cl.⁴ .......................... H03F 3/45; H03G 3/10; H03B 5/36
[52] U.S. Cl. .................... 330/254; 331/116 R
[58] Field of Search ........................ 330/254, 279; 331/116 R, 177 R; 358/27

[56] References Cited

U.S. PATENT DOCUMENTS

| | | | |
|---|---|---|---|
| 3,691,475 | 9/1972 | Mouri et al. | 331/116 R X |
| 4,065,725 | 12/1977 | Lillis et al. | 330/254 |
| 4,318,051 | 3/1982 | Harwood et al. | 330/254 |
| 4,426,625 | 1/1984 | Harwood et al. | 330/254 |

FOREIGN PATENT DOCUMENTS

54-19989 7/1979 Japan .
2068187 8/1981 United Kingdom .

Primary Examiner—James B. Mullins
Attorney, Agent, or Firm—Cushman, Darby & Cushman

[57] ABSTRACT

A voltage-controlled circuit includes a control voltage source for providing a variable control voltage, a first current source for providing a first current whose magnitude is changed with the variation of the control voltage, a first potential source for providing a first potential which depends on the magnitude of the first current, a second current source for providing a second current, a second potential source for providing a second potential which depends on the magnitude of the second current, and a differential amplifier circuit which is formed of a first transistor having a base coupled to the first potential source and a second transistor having a base coupled to the second potential source. An input signal is supplied to the emitter circuit of the first and second transistors, and an output signal is delivered from the collector circuit of the first or second transistor. The output/input characteristic of the differential amplifier circuit is changed by the control voltage. The first current source is provided with means for expanding the linear range of the output/input characteristic of the differential amplifier circuit vs. the control voltage.

31 Claims, 9 Drawing Figures

VOLTAGE-CONTROLLED CIRCUIT

BACKGROUND OF THE INVENTION

The present invention relates to a voltage-controlled circuit by which an electric characteristic (e.g., the gain of an amplifier, the attenuation degree of an attenuator or the frequency of an oscillator) is electronically changed in accordance with a control voltage and, in particular, to a voltage-controlled amplifier (or voltage-controlled attenuator) used for adjusting sound volume or any other analog quantity.

Conventionally, various electric characteristics, such as a gain, frequency, etc., have to be changed by a control voltage. In a sound volume control circuit adapted to audio/visual (A/V) equipment, the gain of an audio amplifier is changed with the voltage of a volume control signal. Such a sound volume control circuit is often made of circuit-integrated differential amplifiers controlled by a DC control voltage, and it can be embodied by, e.g., a gain control circuit of U.S. Pat. No. 4,065,725 (Lillis et al.) issued on Dec. 27, 1977.

Figure 2A:
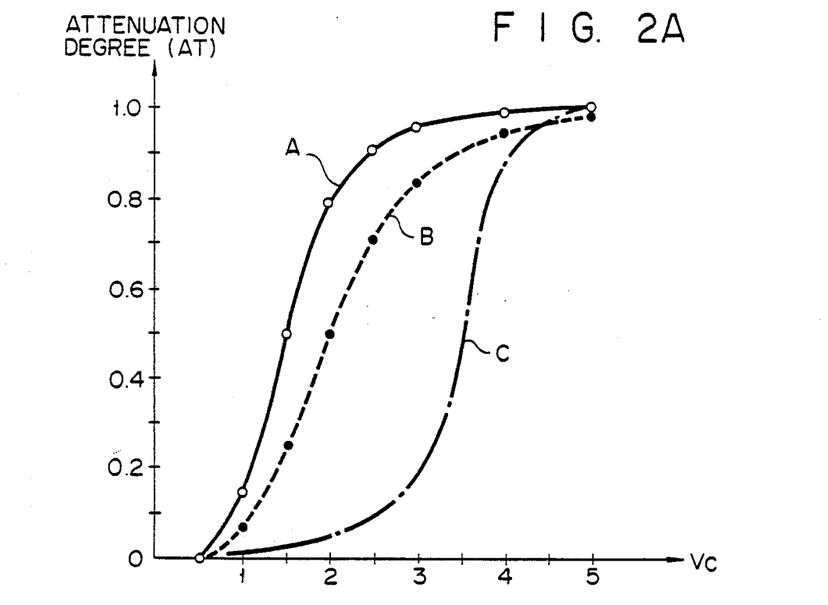
FIG. 2A illustrates typical characteristics (curves A and B) of the attenuation degree vs. control voltage Vc of the sound volume control circuit shown in FIG. 1, in which a typical characteristic (curve C) of a prior art is also exemplified.
Figure 2B:
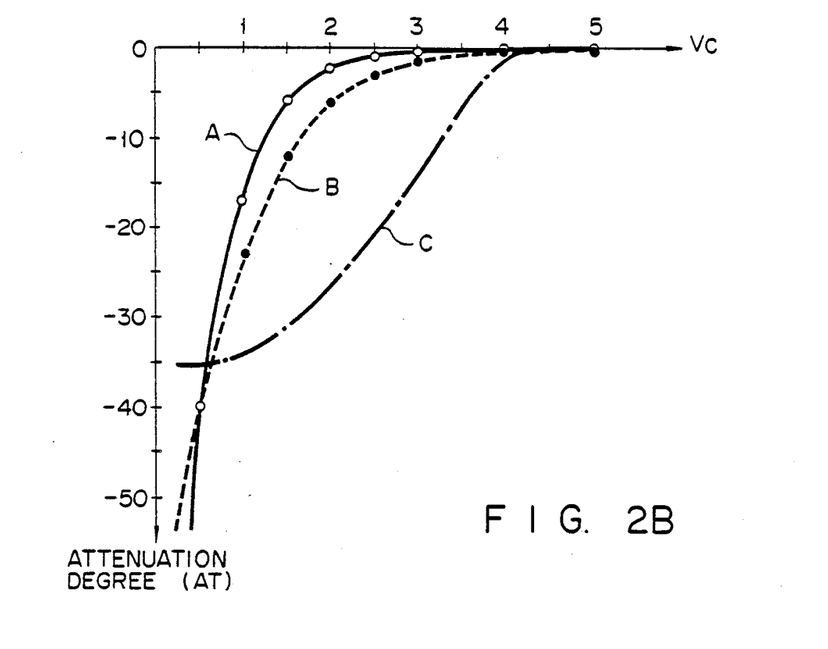
FIG. 2B corresponds to the illustration of FIG. 2A but the vertical axis is changed to a log (dB) scale.

A typical characteristic of the attenuation degree vs. control voltage of the above prior art circuit may be represented by curve C shown in FIG. 2A or 2B of this patent application (cf. FIG. 2 of U.S. Pat. No. 4,065,725). This characteristic teaches that below 1 volt of control voltage Vc (or above 3 volts of $V_{EGC}$ in FIG. 2 of the U.S. Pat. No. 4,065,725), the linearlity of curve C is degraded. In other words, within a range of high-attenuation degree (below −30 dB in FIG. 2B), the rate of change of a sound volume with respect to the change of control voltage Vc is very small. Consequently, under certain circumstances where a small sound volume is required to the operation of AV equipment, unless the set position of a sound volume controller is significantly changed, substantial changes for the sound volume cannot be achieved. Further, when a full mute of the sound volume by the manipulation of the controller is needed, it is practically impossible if the sound volume control circuit has a characteristic such as indicated by curve C in FIG. 2B because the maximum attenuation degree of curve C is about −35 dB. These are the disadvantages of the prior art. Actually, the linear range of the attenuation degree vs. control voltage should be as wide as possible, and the maximum attenuation degree should be as high as possible.

SUMMARY OF THE INVENTION

It is accordingly an object of the present invention to provide a voltage-controlled circuit by which a linearity of the controllable range of an electric characteristic with respect to a control voltage is improved.

To achieve the above object, a voltage-controlled circuit of the invention comprises a control voltage source for providing a variable control voltage; a first current source, coupled to the control voltage source, for providing a first current whose magnitude is changed with the variation of the control voltage; a first potential source, coupled to the first current source, for providing a first potential which depends on the magnitude of the first current; a second current source for providing a second current; a second potential source, coupled to the second current source, for providing a second potential which depends on the magnitude of the second current; and an amplifier circuit which may be formed of a first transistor having a base coupled to the first potential source and a second transistor having a base coupled to the second potential source. An input signal such as a voice signal is supplied to the emitter circuit of the first and second transistors, and an output signal is delivered from the collector circuit of the first or second transistor. The output/input characteristic of the amplifier circuit is changed by the control voltage. In the above voltage-controlled circuit, the first current source is provided with means for expanding the linear range of the output/input characteristic of the amplifier circuit vs. the control voltage (cf. curve A or B in FIG. 2B).

DETAILED DESCRIPTION OF THE PREFERRED EMBODIMENTS

Hereinafter, preferred embodiments of the invention will be described in detail with reference to the accompanying drawings. In the following description, the same or similar elements are denoted by the same or similar reference numerals throughout the drawings.

Figure 1:
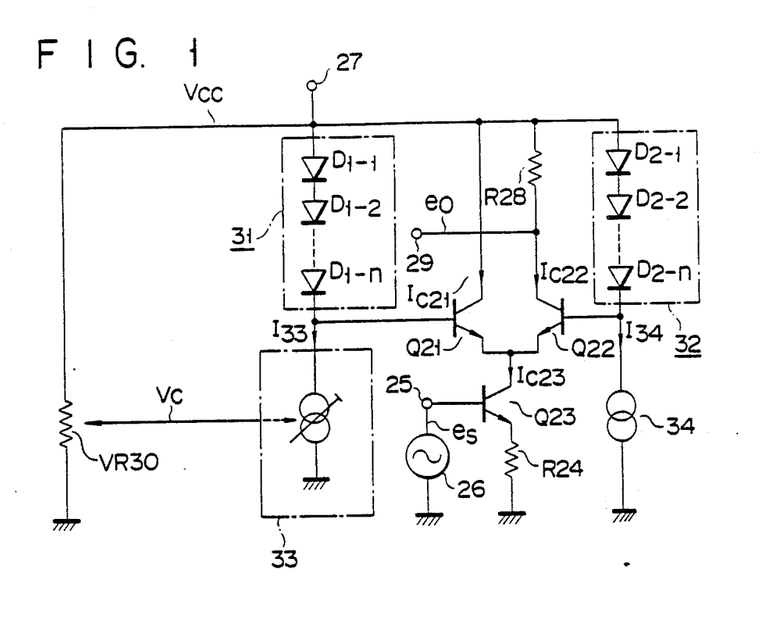
FIG. 1 shows a schematic configuration of a sound volume control circuit which is an application of a voltage-controlled circuit according to the present invention.

Referring to FIG. 1, variable resistor VR30 is coupled between positive power supply 27 and the circuit ground. The slider of VR30 provides control voltage Vc which can be varied from 0 volt to power source voltage Vcc. Current source 33 is responsive to control voltage Vc and provides current I33 whose magnitude depends on Vc. Source 33 is coupled to power supply 27 via diode circuit 31. Circuit 31 is formed of n series-connected diodes $D_{1-1}$ to $D_{1-n}$ which are forwardly biased by current I33. Current source 34 for providing current I34 is coupled to power supply 27 via diode circuit 32. Circuit 32 is formed of n series-connected diodes $D_{2-1}$ to $D_{2-n}$ which are forwardly biased by current I34.

The node between diode circuit 31 and current source 33 is connected to the base of NPN transistor Q21. The node between diode circuit 32 and current source 34 is connected to the base of NPN transistor Q22. The collector of Q21 is connected to power supply 27, and the collector of Q22 is coupled to power supply 27 via resistor R28. The emitter of each of Q21 and Q22 is connected to the collector of NPN transistor Q23.

The emitter of Q23 is circuit-grounded via resistor R24. Transistors Q21–Q23 and resistors R24, R28 constitute a differential amplifier circuit. The base of Q23 is connected to input terminal 25. Input signal es from signal source 26 is applied to terminal 25. Output signal eo of the differential amplifier circuit is delivered from the collector of Q22 through output terminal 29.

In the circuit of FIG. 1, the following equation can be established:

$$I33/I34 = K1 \cdot Vc + K2 \quad (1)$$

where K1 and K2 are proportional constants (K1 is not zero).

Here, it is assumed that VF1 denotes the forward voltage drop appearing across each diode in circuit 31, that VF2 denotes the forward voltage drop appearing across each diode in circuit 32, that VF21 denotes the forward voltage drop appearing across the base-emitter of transistor Q21, that VF22 denotes the forward voltage drop appearing across the base-emitter of transistor Q22, that Ic21 denotes the collector current of transistor Q21, that Ic22 denotes the collector current of transistor Q22, and that Ic23 denotes the collector current of transistor Q23.

Under the above assumption, when the emitter potential of transistors Q21 and Q22 is considered, the following equation is established:

$$Vcc - n \cdot VF1 - VF21 = Vcc - n \cdot VF2 - VF22 \quad (2)$$

As is well known, the base-emitter forward voltage drop VF can be represented as:

$$VF = (KT/q) \ln(Ic/Is) \quad (3)$$

where K denotes the Boltzmann's constant, T denotes the absolute temperature, Ic denotes the collector current of a bipolar transistor, and Is denotes the reverse saturation current of the bipolar transistor. When the circuit of FIG. 1 is circuit-integrated in a single chip semiconductor wafer and each diode of circuits 31 and 32 is formed by a base-collector-connected transistor structure, a relation $VF = VF1 = VF2$ can be practically obtained. In this case, from equation (3), base potential VB21 ($=Vcc - n \cdot VF1$) of transistor Q21 and base potential VB22 ($=Vcc - n \cdot VF2$) of transistor Q22 can be represented as follows:

$$VB21 = Vcc - n \cdot [(KT/q)\ln(Ic31/Is31)] \quad (4)$$

$$= Vcc - (KT/q)\ln(Ic31/Is31)^n$$

$$VB22 = Vcc - n \cdot [(KT/q)\ln(Ic32/Is32)] \quad (5)$$

$$= Vcc - (KT/q)\ln(Ic32/Is32)^n$$

where Ic31 denotes the collector current of each of diode transistors in circuit 31, Is31 denotes the reverse saturation current thereof, Ic32 denotes the collector current of each of diode transistors in circuit 32, and Is32 denotes the reverse saturation current thereof.

The effective input of the differential amplifier (Q21–Q23) of FIG. 1 is potential difference V between VB21 and VB22:

$$V = VB22 - VB21 \quad (6)$$

$$= (KT/q)\ln(Ic31/Is31)^n - (KT/q)\ln(Ic32/Is32)^n$$

$$= (KT/q)[\ln(Ic31 \cdot Is32/Is31 \cdot Ic32)^n]$$

$$= (KT/q)[\ln(Ic31/Ic32)^n - \ln(Is31/Is32)^n]$$

When the characteristics of each diode in circuit 31 are substantially identical to those in circuit 32, $Is31 = Is32$ is practically obtained so that $\ln(Is31/Is32)^n$ becomes zero. Then, equation (6) is simplified as:

$$V = (KT/q) \ln (Ic31/Ic32)^n \quad (7)$$

In the circuit of FIG. 1, since $Ic31 = I33$ and $Ic32 = I34$ are established, equation (7) can be modified as:

$$V = (KT/q) \ln (I33/I34)^n \quad (8)$$

Similarly, base-emitter voltage drop VF21 of transistor Q21 and base-emitter voltage drop VF22 of transistor Q22 are:

$$VF21 = (KT/q) \ln (Ic21/Is21) \quad (9)$$

$$VF22 = (KT/q) \ln (Ic22/Is22) \quad (10)$$

Further, potential difference V between VB21 and VB22 is:

$$V = VB22 - VB21 = VF22 - VF21 \quad (11)$$

$$= (KT/q)[\ln(Ic22/Ic21) - \ln(Is22/Is21)]$$

When the characteristics of transistor Q21 are substantially identical to those of transistor Q22, $Is21 = Is22$ is practically obtained so that $\ln(Is22/Is21)$ becomes zero. Then, equation (11) is simplified as:

$$V = (KT/q)\ln(Ic22/Ic21) \quad (12)$$

From equations (8) and (12), the following equations are established:

$$(KT/q) \ln (I33/I34)^n = (KT/q) \ln (Ic22/Ic21) \quad (13)$$

$$(Ic22/Ic21) = (I33/I34)^n \quad (14)$$

Here, since $Ic21 + Ic22 = Ic23$ (= collector current of Q23) holds, equation (14) can be modified as follows:

$$(Ic22/Ic23) = (I33/I34)^n / [1 + (I33/I34)^n] \quad (15)$$

In the circuit of FIG. 1, the signal attenuation degree (eo/es) is proportional to the current dividing ratio between Q21 and Q22. Accordingly, the following equation is established:

$$eo = -(R28/R24)(Ic22/Ic23) \cdot es \quad (16)$$

where the negative sign means that the differential amplifier of FIG. 1 operates as an inverting amplifier.

According to the circuit configuration of FIG. 1, maximum output eomax of output eo is obtained when transistor Q21 is cut off so that $Ic22 = Ic23$. In this case, $$eomax = -(R28/R24) \cdot es \quad (17)$$

is established. From equations (16) and (17), the following equation is obtained:

$$eo/eomax = Ic22/Ic23 = AT \quad (18)$$

where AT denotes the attenuation degree of the differential amplifier of FIG. 1, and the maximum value of eo/eomax is 1.

From equations (1), (15) and (18), the following is obtained:

$$AT = (K1 \cdot Vc + K2)^n / [1 + (K1 \cdot Vc + K2)^n] \quad (19)$$

Equation (19) represents the characteristic of attenuation degree AT versus control voltage Vc of FIG. 1. When K1=0.6, K2=0.1 and n=5 are applied to equation (19), curve A shown in FIG. 2A or 2B is obtained. When K1=0.4, K2=0.2 and n=5 are applied to equation (19), curve B shown in FIG. 2A or 2B is obtained.

Curve A or B in FIG. 2B teaches that within a range of high-attenuation degree (below −30 dB in FIG. 2B), the rate of change of attenuation degree AT with respect to the change of control voltage Vc is sufficiently large. Further, it also shows that the linear range of AT versus Vc is so wide, and the maximum attenuation degree can be sufficiently high. Consequently, a user of A/V equipment can enjoy a convenient manipulation of the A/V equipment regardless of the magnitude of the sound volume and, even if the user wishes to fully mute the sound volume by the manipulation of the controller, it can be easily done. These are the advantages of the present invention.

Assume a case where attenuation degree AT=1/10 is to be obtained. In this case, equation (19) may be modified as follows:

$$AT/10 = (0.5K1 \cdot Vc + K2)^n / [1 + (0.5K1 \cdot Vc + K2)^n] \quad (20)$$

When respective parameters K1, Vc, K2 and n are determined so that equation (20) is established, AT=1/10 is obtained. (Parameter n is an integral number.) If K2=0, the condition establishing that AT=1/10 is:

$$(K1 \cdot Vc)^n = (2^n - 10)/9 \quad (21)$$

When a specific value for parameter Vc is given, other parameters K1 and n are determined so that equation is satisfied. Then, AT=1/10 is obtained at the specific value of Vc. Of course, there are many conditions other than equation (21), which provides AT=1/10.

Figure 3:
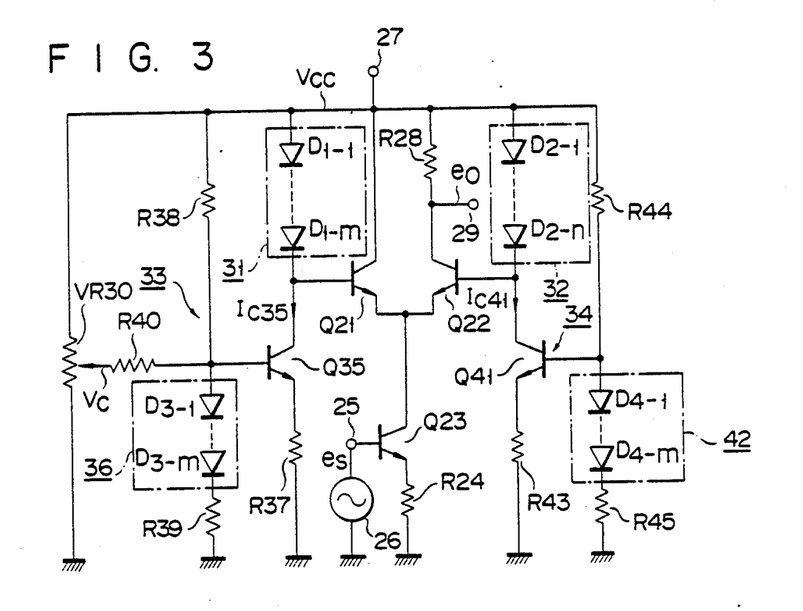
FIG. 3 is a detailed circuit diagram representing the configuration of FIG. 1.

FIG. 3 is a detailed circuit diagram representing the configuration of FIG. 1. In FIG. 3, current source 33 is formed of NPN transistor Q35, diode circuit 36 and resistors R37-R40. The emitter of Q35 is circuit-grounded via resistor R37. The collector of Q35 is coupled to positive power supply 27 via diode circuit 31. The n series-connected diodes $D_{1\text{-}1}$ to $D_{1\text{-}n}$ of circuit 31 are forwardly biased by collector current Ic35 of transistor Q35. Current Ic35 corresponds to current I33 in FIG. 1. The base of Q35 is coupled via resistor R40 to the slider of variable resistor VR30. Also, the base of Q35 is coupled via resistor R38 to power supply 27 and via diode circuit 36 and resistor R39 to the circuit ground. Circuit 36 is formed of m series-connected diodes $D_{3\text{-}1}$ to $D_{3\text{-}m}$ which are forwardly biased by a current flowing through the series circuit of R38, 36 and R39.

Current source 34 is formed of NPN transistor Q41, diode circuit 42 and resistors R43-R45. The emitter of Q41 is circuit-grounded via resistor R43. The collector of Q41 is coupled to positive power supply 27 via diode circuit 32. The n series-connected diodes $D_{2\text{-}1}$ to $D_{2\text{-}n}$ of circuit 32 are forwardly biased by collector current Ic41 of transistor Q41. Current Ic41 corresponds to current I34 in FIG. 1. The base of Q41 is coupled via resistor R44 to power supply 27, and it is also coupled via diode circuit 42 and resistor R45 to the circuit ground. Circuit 42 is formed of m series-connected diodes $D_{4\text{-}1}$ to $D_{4\text{-}m}$ which are forwardly biased by a current flowing through the series circuit of R44, 42 and R45.

Other circuit connections of FIG. 3 are the same as those of FIG. 1. (The same reference symbol denotes the same circuit element.)

In the following description, it is assumed that the number of the diodes in circuit 36 is "m1", that the number of the diodes in circuit 42 is "m2", and that each diode in circuits 36 and 42 is made of a base-collector-connected transistor.

Assume that the voltage dividing coefficient of variable resistor VR30 is p (which can be varied from 0 to 1), and that control voltage Vc depends only on power supply voltage Vcc and coefficient p. Then, the following equation is obtained:

$$Vc = p \cdot Vcc \quad (22)$$

Then, collector current Ic35 of Q35 (=I33 in FIG. 1) and collector current Ic41 of Q41 (=I34 in FIG. 1) are as follows:

$$Ic35 = (1/R37)[\{(p \cdot R39/R40 + R39/R38)/(R39/R40 + R39/R38 + 1)\} \cdot Vcc + \{m1/(R39/R40 + R39/R38 + 1) - 1\} \cdot VF] \quad (23)$$

and, $$Ic41 = (1/R43)[\{(R45/R44)/(R45/R44 + 1)\} \cdot Vcc + \{m2/(R45/R44 + 1) - 1\} \cdot VF] \quad (24)$$

Further, assume that:

$$m1 = R39/R40 + R39/R38 + 1 \quad (25)$$

$$m2 = R45/R44 + 1 \quad (26)$$

When equations (25) and (26) are substituted into equations (23) and (24), respectively, the term of "VF" can be erased, and the following equations are obtained:

$$Ic35 = (1/m1 \cdot R37)(p \cdot R39/R40 + R39/R38) \cdot Vcc \quad (27)$$

$$Ic41 = (1/m2 \cdot R43)(R45/R44) \cdot Vcc \quad (28)$$

From equation (22), p=Vc/Vcc is obtained. When the relation p=Vc/Vcc is substituted into equation (27), the following is obtained:

$$Ic35 = (1/m1 \cdot R37)[(R39/R40) \cdot Vc + (R39/R38) \cdot Vcc] \quad (29)$$

From equations (27) and (28), the following is established:

$$Ic35/Ic41 = (m2/m1)(R43/R37)(R44/R45)(p \cdot R39/R40 + R39/R38) \quad (30)$$

Equation (30) can be modified by equations (25) and (26) as follows:

$$Ic3-5/Ic41=(m2/m1)(R43/R37)(m2-1)(p.R39/R40-+m1-1-R39/R40) \quad (31)$$

When relations Ic35 (FIG. 3)=I33 (FIG. 1) and Ic41 (FIG. 3)=I34 (FIG. 1) and said relation p=Vc/Vcc are applied to equation (31), the following equations are derived from equations (1) and (31):

$$K1=[m2(m2-1)/m1](R43/R37)(R39/R40)(1/Vcc) \quad (32A)$$

$$K2=[m2(m2-1)/m1](R43/R37)(m1-1-R39/R40) \quad (32B)$$

When it is assumed that m1=m2=2 and R37=R43, the following equations are obtained:

$$K1=(R39/R40)(1/Vcc) \quad (33A)$$

$$K2=(1-R39/R40) \quad (33B)$$

Equations (33A) and (33B) teach that parameters K1 and K2 of equation (1) are determined in accordance with resistors R39 and R40 and power supply voltage Vcc. According to a recent IC manufacturing technology, it is practically easy to realize accurate resistance ratio R39/R40. Therefore, if voltage Vcc is sufficiently stabilized, stable parameters K1 and K2 can be obtained.

In the circuit of FIG. 3, elements 36 and R37–R40 serve as linearity compensation means for expanding the linear range of the variation of output signal eo with respect to control voltage Vc.

Incidentally, the range of variation of control voltage Vc may be narrower than the range between 0 volt and Vcc. The range of variation of Vc may be freely determined.

Figure 4:
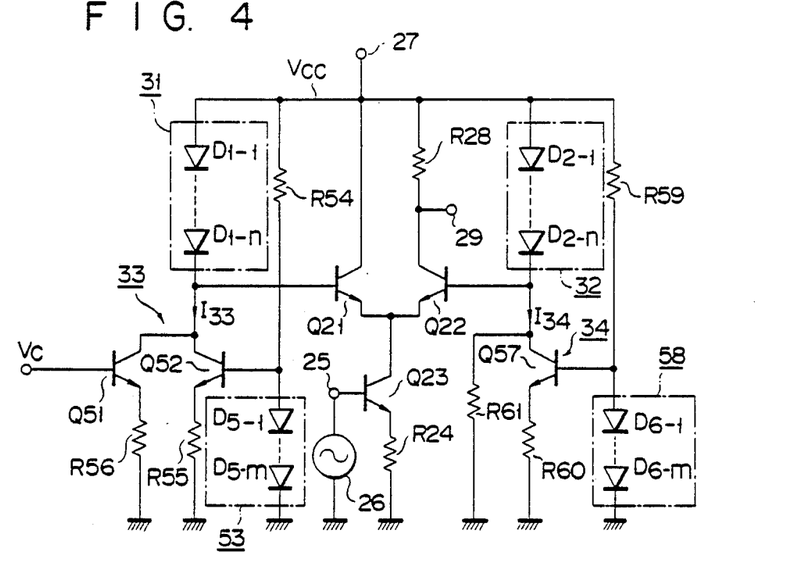
FIG. 4 is a modification of the circuit shown in FIG. 3.

FIG. 4 is a modification of the circuit shown in FIG. 3. In FIG. 4, current source 33 is formed of NPN transistors Q51 and Q52, diode circuit 53, and resistors R54–R56. The emitter of Q51 is circuit-grounded via resistor R56. The emitter of Q52 is circuit-grounded via resistor R55. The collector of each of Q51 and Q52 is coupled to positive power supply 27 via diode circuit 31. The n series-connected diodes $D_{1-1}$ to $D_{1-n}$ of circuit 31 are forwardly biased by current I33 which is the sum of the collector currents of Q51 and Q52. The base of Q51 receives control voltage Vc. The base of Q52 is coupled via resistor R54 to power supply 27 and via diode circuit 53 to the circuit ground. Circuit 53 is formed of m series-connected diodes $D_{5-1}$ to $D_{5-m}$ which are forwardly biased by a current flowing through the series circuit of R54 and 53.

Current source 34 is formed of NPN transistor Q57, diode circuit 58 and resistors R59–R61. The emitter of Q57 is circuit-grounded via resistor R60. The collector of Q57 is coupled to power supply 27 via diode circuit 32. The n series-connected diodes $D_{2-1}$ to $D_{2-n}$ of circuit 32 are forwardly biased by collector current I34 of transistor Q57. The collector of Q57 is circuit-grounded via resistor R61. The base of Q57 is coupled via resistor R59 to power supply 27, and it is also coupled via diode circuit 58 to the circuit ground. Circuit 58 is formed of m series-connected diodes $D_{6-1}$ to $D_{6-m}$ which are forwardly biased by a current flowing through the series circuit R59 and 58.

Other circuit connections of FIG. 4 are the same as those of FIG. 1. (The same reference symbol denotes the same circuit element.)

In the following description, it is assumed that the number of the diodes in circuit 53 is "m3", that the number of the diodes in circuit 58 is "m4", and that each diode in circuits 53 and 58 is made of a base-collector-connected transistor.

In the circuit of FIG. 4, currents I33 and I34 can be represented as follows:

$$I33=(Vc/R56)+[(m3-1)/R55-(1/R56)].VF \quad (34)$$

$$I34=(VC/R61)+[(m4-1)/R60-(n/R61)].VF \quad (35)$$

where n denotes the number of diodes in circuit 32.

Here, it is assumed that the following relations are established:

$$(m3-1)/R55=(1/R56) \quad (36A)$$

$$(m4-1)/R60=(n/R61) \quad (36B)$$

Under the assumption of equations (36A) and (36B), equations (34) and (35) are modified as follows:

$$I33=(Vc/R56) \quad (37A)$$

$$I34=(Vc/R61) \quad (37B)$$

From equations (22), (37A) and (37B), the following equation can be obtained:

$$I33/I34=(R61/R56)(Vc/Vcc)=(R61/R56).p \quad (38)$$

From equations (1) and (38), we obtain:

$$K1=(R61/R56)(1/Vcc) \quad (39A)$$

$$K2=0 \quad (39B)$$

Equation (38) teaches that current ratio I33/I34 depends only on resistance ratio R61/R56 and voltage dividing coefficient p of variable resistor VR30. Thus, ratio I33/I34 is free of power supply voltage Vcc.

Incidentally, a base bias circuit, which is formed of elements R38–R40 and 36 as shown in FIG. 3, may be adapted to the base circuit of transistor Q51 in FIG. 4.

Figure 5:
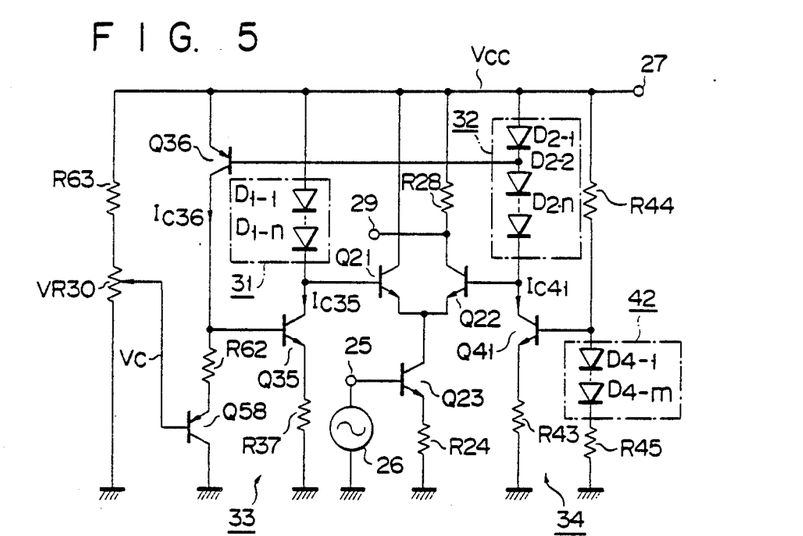
FIG. 5 is another modification of the circuit shown in FIG. 3.

FIG. 5 is another modification of the circuit shown in FIG. 3. In FIG. 5, the base of NPN transistor Q35 is connected to the collector of PNP transistor Q36. The emitter of Q35 is circuit-grounded via resistor R37. The emitter of Q36 is connected to power supply 27. The base of Q36 is connected to the cathode of diode $D_{2-1}$ whose anode is connected to the power supply 27. Diode $D_{2-1}$ is the first one of the series-connected diodes $D_{2-1}$ to $D_{2-n}$. The collector of Q36 is coupled via resistor R62 to the emitter of PNP transistor Q58. The collector of Q58 is circuit-grounded. The base Q58 receives control voltage Vc from the slider of variable resistor VR30. One end of VR30 is circuit-grounded and the other end thereof is coupled via resistor R63 to power supply 27.

In the circuit of FIG. 5, collector current Ic35 of transistor Q35 can be represented as follows:

$$Ic35=(Vc+VF_{Q58}+R62.Ic36-VF_{Q35})/R37 \quad (40)$$

where $VF_{Q35}$ denotes the base-emitter voltage of Q35, $VF_{Q58}$ denotes the base-emitter voltage of Q58, and Ic36 denotes the collector current of Q36. When transistor Q36 and diode $D_{2-1}$ constitute a current mirror circuit, $$Ic36 = Ic41 \quad (41)$$

is established. Further, when a proper design is applied to the semiconductor manufacturing process of Q58 and Q35, the relation $$VF_{Q58} = VF_{Q35} \quad (42)$$

can be established. When equations (41) and (42) are substituted into equation (40), we obtain $$IC35 = (Vc + R62.Ic41)/R37 \quad (43)$$

Equation (43) can be modified as follows:

$$Ic35/Ic41 = (Vc/R37.Ic41) + R62/R37 \quad (44)$$

When equation (28) is substituted into equation (44), the following equations are obtained:

$$Ic35/Ic41 = (m2/Vcc)(R43/R37)(R44/R45) \cdot Vc + (R62/R37) \quad (45)$$

$$K1 = (m2/Vcc)(R43/R37)(R44/R45) \quad (46A)$$

$$K2 = (R62/R37) \quad (46B)$$

Equation (45) teaches that current ratio Ic35/Ic41 depends only on the resistance ratios and Vcc and is proportional to Vc. Equations (46A) and (46B) teach that parameters K1 and K2 used in the relation of equation (19) can be determined by the resistance ratios and Vcc.

Figure 6:
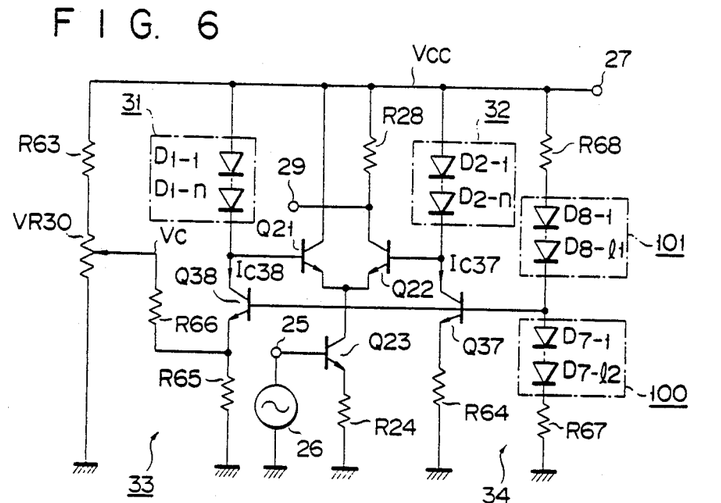
FIG. 6 is still another modification of the circuit shown in FIG. 3.

FIG. 6 is still another modification of the circuit shown in FIG. 3. In FIG. 6, the collector of NPN transistor Q38 is coupled via diode circuit 31 to power supply 27. The emitter of Q38 is circuit-grounded via resistor R65 and is also coupled via resistor R66 to the slider of variable resistor VR30. The base of Q38 is connected to the base of NPN transistor Q37. The collector of Q37 is coupled via diode circuit 32 to power supply 27. The emitter of Q37 is circuit-grounded via resistor R64. The bases of Q37 and Q38 are coupled to the circuit ground via the series circuit of diode circuit 100 and resistor R67, and they are also coupled to power supply 27 via the series circuit of resistor R68 and diode circuit 101. Circuit 100 is formed of $l_2$ series-connected diodes $D_{7-1}$ to $D_{7-l_2}$. Circuit 101 is formed of $l_1$ series-connected diodes $D_{8-1}$ to $D_{8-l_1}$.

In the circuit of FIG. 6, it is assumed that the emitter potential of Q37 is VE37, that the emitter potential of Q38 is VE38, that the base-emitter voltage of Q37 is $VF_{Q37}$, that the base-emitter voltage of Q38 is $VF_{Q38}$, and that $VF_{Q37} = VF_{Q38}$ (=VF). Then, VE37=VE38=VE is obtained. In this case, emitter potential VE is:

$$VE = [R67/(R67 + R68)] \cdot Vcc + [l_2 - 1 - R67(l_1 + l_2)/(R67 + R68)] \cdot VF \quad (47)$$

where $l_1$ denotes the number of series-connected diodes in circuit 101, $l_2$ denotes the number of series-connected diodes in circuit 100, and VF denotes the forward voltage drop of each diode in circuits 100 and 101 and is equal to $VF_{Q37}$ and $VF_{Q38}$.

When the following equation is established, $$(l_2 - 1)/(l_1 + l_2) = R67/(R67 + R68) \quad (48)$$

equation (47) can be simplified as:

$$VE = [R67/(R67 + R68)] \cdot Vcc \quad (49)$$

When equation (49) is established, collector current Ic37 of Q37 and collector current Ic38 of Q38 are:

$$Ic37 = VE/R64 \quad (50)$$

$$Ic38 = (Vc - VE)/R66 + VE/R65 \quad (51)$$

From equations (50) and (51), we obtain:

$$Ic38/Ic37 = (R64/R66)(Vc/VE) + (R64/R65) - (R64/R66) \quad (52)$$

When equation (49) is substituted into equation (52), we obtain:

$$Ic38/Ic37 = (R64/R66)(1 + R68/R67)(1/Vcc) \cdot Vc + (R64/R65) - (R64/R66) \quad (53)$$

$$K1 = (R64/R66)(1 + R68/R67)(1/Vcc) \quad (54A)$$

$$K2 = (R64/R65) - (R64/R66) \quad (54B)$$

Equation (53) teaches that current ratio Ic38/Ic37 depends only on the resistance ratios and Vcc and is proportional to Vc. Equations (54A) and (54B) teach that parameters K1 and K2 used in the relation of equation (19) can be determined by the resistance ratios and Vcc.

Figure 7:
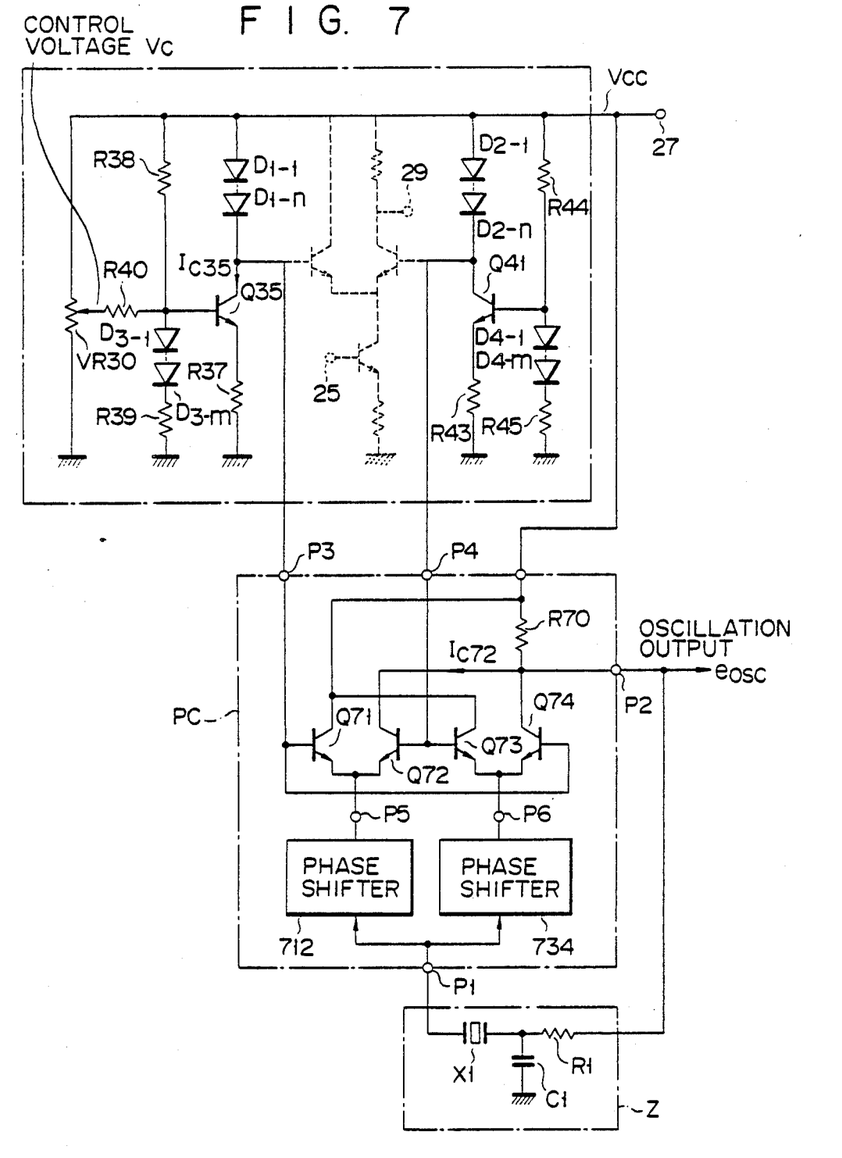
FIG. 7 shows a voltage-controlled oscillator (VCO) which is another application of the voltage-controlled circuit according to the present invention.

FIG. 7 shows a voltage-controlled oscillator (VCO) which is an application of the voltage-controlled circuit according to the present invention. In the circuit of FIG. 7, a specific part of FIG. 3, other than the differential amplifier part (Q21–Q23, R24, R28), is adapted. The collector of NPN transistor Q35 is connected, via terminal P3, to the base of each of NPN transistors Q71 and Q74. The collector of NPN transistor Q41 is connected, via terminal P4, to the base of each of NPN transistors Q72 and Q73. The collectors of Q71 and Q73 are connected to positive power supply 27. The collectors of Q72 and Q74 are connected via resistor R70 to power supply 27. The collectors of Q72 and Q74 are coupled, via terminal P2, resonance circuit Z and terminal P1, to each of phase shifters 712 and 734. Thus, oscillation output $e_{osc}$ of the VCO delivered from terminal P2 is fed, via resonance circuit Z, back to terminal P1. An output of phase shifter 712 is supplied, via terminal P5, to the emitters of Q71 and Q72. An output of phase shifter 734 is supplied, via terminal P6, to the emitters of Q73 and Q74. Transistors Q71–Q74 constitute a double-balanced differential amplifier circuit. Resonance circuit Z is formed of a series circuit of a low-pass filter (R1 and C1) and crystal resonator X1.

Circuit elements Q71–Q74, R70, 712 and 734 constitute phase control circuit PC. In circuit PC, the phase shift amount of shifter 712 differs from that of shifter 734, so that the signal phase deviation between terminals P1 and P2 is controlled by the potential difference between terminals P3 and P4. The potential difference between terminals P3 and P4 can be changed in accordance with control voltage Vc. Consequently, oscillation frequency $f_{osc}$ of output $e_{osc}$ can be changed by control voltage Vc.

Figure 8:
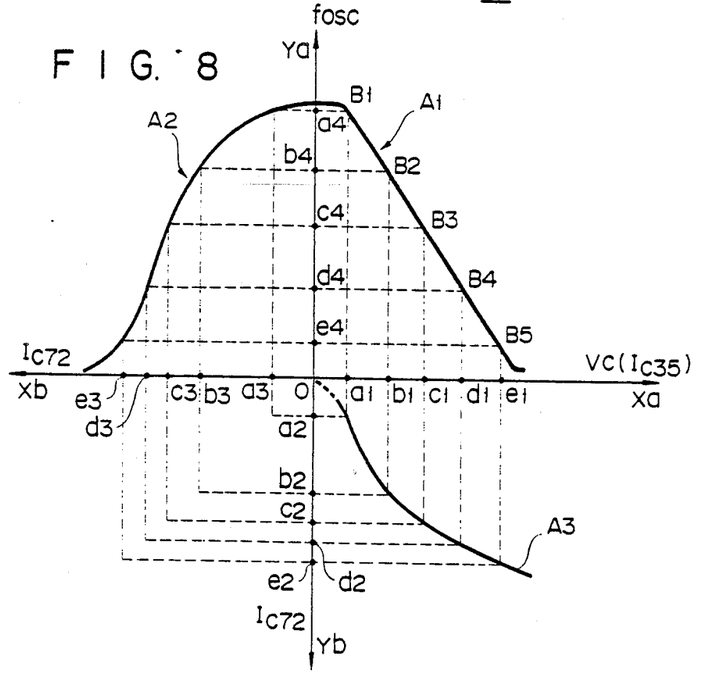
FIG. 8 is a schematic illustration explaining the characteristic of the VCO in FIG. 7.

FIG. 8 is a schematic illustration explaining the characteristic of the VCO in FIG. 7. In FIG. 8, curve A1 in the first quadrant (Ya—Xa) shows control voltage Vc (or collector current Ic35 of Q35) vs. oscillation frequency $f_{osc}$. Curve A2 in the second quadrant (Ya—Xb)

shows collector current Ic72 of Q72 vs. oscillation frequency $f_{osc}$. Curve A3 in the fourth quadrant (Yb—Xa) shows collector current Ic72 vs. control voltage Vc. The characteristic of Vc versus $f_{osc}$ of a conventional VCO is similar to curve A2.

Assume that control voltage Vc is set at point a1 on Xa axis. In this case, according to curve A3, current Ic72 is at pont a2 on Yb axis. Point a2 on Yb axis corresponds to point a3 on Xb axis. According to curve A2, current Ic72 at point a3 on Xb axis corresponds to point a4 on Ya axis. Then, control voltage Vc at point a1 is related, at point B1 on A1, to oscillation frequency $f_{osc}$ at point a4. In a similar manner, voltages Vc at points b1-e1 are related, at points B2-B5 on curve A1, to frequencies $f_{osc}$ at points b4-e4, respectively. In this way, linear curve A1 plotted on points B1-B5 is obtained.

As will be seen from the illustration of FIG. 8, according to the circuit operation of FIG. 7, the non-linearity of curve A2 is compensated by the non-linearity of curve A3, so that linear curve A1 of Vc versus $f_{osc}$ is obtained.

Incidentally, instead of controlling current source 33 by Vc, only current source 34 may be controlled by Vc, or both current sources 33 and 34 may be simultaneously controlled by control voltages. In this case, circuit elements R44, R45 and 42 in FIG. 3, for example, are replaced with circuit elements which are similar to R38-R40, VR30 and 36, so that the base potential of transistor Q41 is changed with another control voltage (Vc*). Then, a potential difference corresponding to the control voltage difference (Vc—Vc*) is applied across the bases of transistors Q35 and Q41. The attenuation degree (AT) of this circuit is controlled by the above potential difference.

While the invention has been described in connection with what is presently considered to be the most practical and preferred embodiment, it is understood that the invention is not to be limited to the disclosed embodiment but, on the contrary, is intended to cover various modifications and equivalent arrangements included within the scope of the appended claims which scope is to be accorded the broadest interpretation so as to encompass all such modifications and equivalent structures.

What is claimed is:

1. A voltage-controlled circuit comprising:
   first current source means, responsive to a variable control voltage, for providing a first current whose magnitude is changed with the variation of said control voltage;
   first potential source means, coupled to said first current source means, for providing a first potential which depends on the magnitude of said first current, said first current source means having a greater circuit impedance than said first potential source means;
   second current source means for providing a second current;
   second potential source means, coupled to said second current source means, for providing a second potential which depends on the magnitude of said second current;
   circuit means, coupled to said first and second potential source means, for producing an output signal in accordance with the potential difference between said first potential and said second potential; and
   linearity compensation means, coupled to said first current source means, for expanding the linear range of the variation of said output signal with respect to said control voltage, the ratio of said first current versus said second current substantially having a linear function with respect to said control voltage.

2. A voltage-controlled circuit according to claim 1, wherein said circuit means includes a differential amplifier circuit which is formed of:
   a first transistor having a base coupled to said first potential source;
   a second transistor having a base coupled to said second potential source;
   an emitter circuit, coupled to emitters of said first and second transistors and responsive to an input signal, for feeding emitter currents of said first and second transistors in accordance with said input signal; and
   a collector circuit, coupled to at least one collector of said first and second transistors, for providing said output signal in proportion to said input signal, the ratio of said output signal versus said input signal being changed in accordance with said control voltage.

3. A voltage-controlled circuit according to claim 2, wherein said first potential source means includes a plurality of series-connected diodes which are forwardly biased by said first current to provide said first potential; and
   said second potential source means includes a plurality of series-connected diodes which are forwardly biased by said second current to provide said second potential.

4. A voltage-controlled circuit according to claim 1, wherein said circuit means includes a voltage-controlled oscillator which is formed of:
   a first transistor having a base coupled to said first potential source means;
   a second transistor having a base coupled to said second potential source means;
   a third transistor having a base coupled to said second potential source means;
   a fourth transistor having a base coupled to said first potential source means;
   phase shifter means, coupled to emitters of said first to fourth transistors and responsive to a specific signal, for phase-shifting said specific signal to supply a first signal to emitters of said first and second transistors, and to supply a second signal to emitters of said third and fourth transistors, the phase of said first signal being shifted by a given degree from that of said second signal;
   a collector circuit, coupled to collectors of said second and fourth transistors, for providing said output signal which corresponds to said specific signal; and
   a resonance circuit, coupled to said collector circuit, for feeding said output signal back to said phase shifter means, so that said voltage-controlled oscillator oscillates with a frequency depending on said control voltage.

5. A voltage-controlled circuit according to claim 4, wherein said first potential source means includes a plurality of series-connected diodes which are forwardly biased by said first current to provide said first potential; and
   said second potential source means includes a plurality of series-connected diodes which are forwardly biased by said second current to provide said second potential.

6. A voltage-controlled circuit according to claim 1, wherein said first potential source means includes a plurality of series-connected diodes which are forwardly biased by said first current to provide said first potential; and said second potential source means includes a plurality of series-connected diodes which are forwardly biased by said second current to provide said second potential.

7. A voltage-controlled circuit according to claim 1, wherein said first current source means includes:

a first current source transistor whose emitter is coupled to a first circuit of a power supply of said voltage-controlled circuit, whose collector is coupled via said first potential source means to a second circuit of said power supply, and whose base receives said control voltage;

and said linearity compensation means includes:

a first current feeding circuit connected between said first circuit and the base of said first current source transistor; and a second current feeding circuit connected between said second circuit and the base of said first current source transistor.

8. A voltage-controlled circuit according to claim 7, wherein said second current source means includes:

a second current source transistor whose emitter is coupled to said first circuit, whose collector is coupled via said second potential source means to said second circuit;

a third current feeding circuit connected between said first circuit and the base of said second current source transistor; and a fourth current feeding circuit connected between said second circuit and the base of said second current source transistor.

9. A voltage-controlled circuit according to claim 8, wherein said first current feeding circuit includes a diode forwardly biased by a current flowing through said second current feeding circuit;

and said third current feeding circuit includes a diode forwardly biased by a current flowing through said fourth current feeding circuit.

10. A voltage-controlled circuit comprising:

first current source means, responsive to a variable control voltage, for providing a first current whose magnitude is changed with the variation of said control voltage;

first potential source means, coupled to said first current source means, for providing a first potential which depends on the magnitude of said first current, said first current source means having a greater circuit impedance that said first potential source means;

second current source means for providing a second current;

second potential source means, coupled to said second current source means, for providing a second potential which depends on the magnitude of said second current;

circuit means, coupled to said first and second potential source means, for producing an output signal in accordance with the potential difference between said first potential and said second potential; and linearity compensation means, coupled to said first current source means, for expanding the linear range of the variation of said output signal with respect to said control voltage;

said first current source means comprising:

a first current source transistor having an emitter coupled to a first circuit of a power supply of said voltage-controlled circuit, and having a collector coupled via said first potential source means to a second circuit of said power supply; and an adapted current source transistor having an emitter coupled to said first circuit, a collector coupled to the collector of said first current source transistor, and a base which receives said control voltage;

said linearity compensation means comprising:

a first current feeding circuit connected between said first circuit and the base of said first current source transistor; and a second current feeding circuit connected between said second circuit and the base of said first current source transistor.

11. A voltage-controlled circuit according to claim 10, wherein said circuit means includes a differential amplifier circuit which is formed of:

a first transistor having a base coupled to said first potential source;

a second transistor having a base coupled to said second potential source;

an emitter circuit, coupled to emitters of said first and second transistors and responsive to an input signal, for feeding emitter currents of said first and second transistors in accordance with said input signal; and a collector circuit, coupled to at least one collector of said first and second transistors, for providing said output signal in proportion to said input signal, the ratio of said output signal versus said input signal being changed in accordance with said control voltage.

12. A voltage-controlled circuit according to claim 11, wherein said first potential source means includes a plurality of series-connected diodes which are forwardly biased by said first current to provide said first potential; and said second potential source means includes a plurality of series-connected diodes which are forwardly biased by said second current to provide said second potential.

13. A voltage-controlled circuit according to claim 12, wherein the ratio of said first current versus said second current substantially has a linear function with respect to said control voltage.

14. A voltage-controlled circuit according to claim 10, wherein said first potential source means includes a plurality of series-connected diodes which are forwardly biased by said first current to provide said first potential; and said second potential source means includes a plurality of series-connected diodes which are forwardly biased by said second current to provide said second potential.

15. A voltage-controlled circuit according to claim 14, wherein the ratio of said first current versus said second current substantially has a linear function with respect to said control voltage.

16. A voltage-controlled circuit according to claim 10, wherein said second current source means includes:

a second current source transistor whose emitter is coupled to said first circuit, whose collector is coupled via said second potential source means to said second circuit;

a third current feeding circuit connected between said first circuit and the base of said second current source transistor; and a fourth current feeding circuit connected between said second circuit and the base of said second current source transistor.

17. A voltage-controlled circuit according to claim 16, wherein said first current feeding circuit includes a diode forwardly biased by a current flowing through said second current feeding circuit;

and said third current feeding circuit includes a diode forwardly biased by a current flowing through said fourth current feeding circuit.

18. A voltage-controlled circuit comprising:

first current source means, responsive to a variable control voltage, for providing a first current whose magnitude is changed with the variation of said control voltage;

first potential source means, coupled to said first current source means, for providing a first potential which depends on the magnitude of said first current, said first current source means having a greater circuit impedance than said first potential source means;

second current source means for providing a second current;

second potential source means, coupled to said second current source means, for providing a second potential which depends on the magnitude of said second current;

circuit means, coupled to said first and second potential source means, for producing an output signal in accordance with the potential difference between said first potential and said second potential; and linearity compensation means, coupled to said first current source means, for expanding the linear range of the variation of said output signal with respect to said control range;

said first current source means comprising:

a first current source transistor having an emitter coupled to a first circuit of a power supply of said voltage-controlled circuit, and having a collector coupled via said first potential source means to a second circuit of said power supply;

said linearity compensation means comprising:

a first current feeding transistor having a collector coupled to said first circuit, having an emitter coupled to the base of said first current source transistor, and a base which receives said control voltage, the conductivity type of said first current feeding transistor being different from that of said first current source transistor; and a second current feeding transistor having an emitter coupled to said second circuit, having a collector coupled to the base of said first current source transistor, and a base which receives a given bias voltage, the conductivity type of said second current feeding transistor being the same as that of said first current feeding transistor.

19. A voltage-controlled circuit according to claim 18, wherein said circuit means includes a differential amplifier circuit which is formed of:

a first transistor having a base coupled to said first potential source;

a second transistor having a base coupled to said second potential source;

an emitter circuit, coupled to emitters of said first and second transistors and responsive to an input signal, for feeding emitter currents of said first and second transistors in accordance with said input signal; and a collector circuit, coupled to at least one collector of said first and second transistors, for providing said output signal in proportion to said input signal, the ratio of said output signal versus said input signal being changed in accordance with said control voltage.

20. A voltage-controlled circuit according to claim 19, wherein said first potential source means includes a plurality of series-connected diodes which are forwardly biased by said first current to provide said first potential; and said second potential source means includes a plurality of series-connected diodes which are forwardly biased by said second current to provide said second potential.

21. A voltage-controlled circuit according to claim 20, wherein the ratio of said first current versus said second current substantially has a linear function with respect to said control voltage.

22. A voltage-controlled circuit according to claim 18, wherein said first potential source means includes a plurality of series-connected diodes which are forwardly biased by said first current to provide said first potential; and said second potential source means includes a plurality of series-connected diodes which are forwardly biased by said second current to provide said second potential.

23. A voltage-controlled circuit according to claim 22, wherein the ratio of said first current versus said second current substantially has a linear function with respect to said control voltage.

24. A voltage-controlled circuit comprising:

first current source means, responsive to a variable control voltage, for providing a first current whose magnitude is changed with the variation of said control voltage;

first potential source means, coupled to said first current source means, for providing a first potential which depends on the magnitude of said first current, said first current source means having a greater circuit impedance than said first potential source means;

second current source means for providing a second current;

second potential source means, coupled to said second current source means, for providing a second potential which depends on the magnitude of said second current;

circuit means, coupled to said first and second potential source means, for producing an output signal in accordance with the potential difference between said first potential and said second potential; and linearity compensation means, coupled to said first current source means, for expanding the linear range of the variation of said output signal with respect to said control voltage;

said first current source means comprising:

a first current source transistor having an emitter coupled via a first emitter resistor to a first circuit of a power supply of said voltage-controlled circuit, and a collector coupled via said first potential source means to a second circuit of said power supply, control voltage being applied to the emitter of said first current source transistor;

said linearity compensation means comprising:
- a first current feeding circuit connected between said first circuit and the base of said first current source transistor; and
- a second current feeding circuit connected between said second circuit and the base of said first current source transistor.

25. A voltage-controlled circuit according to claim 24, wherein said circuit means includes a differential amplifier circuit which is formed of:
- a first transistor having a base coupled to said first potential source;
- a second transistor having a base coupled to said second potential source;
- an emitter circuit, coupled to emitters of said first and second transistors and responsive to an input signal, for feeding emitter currents of said first and second transistors in accordance with said input signal; and
- a collector circuit, coupled to at least one collector of said first and second transistors, for providing said output signal in proportion to said input signal, the ratio of said output signal versus said input signal being changed in accordance with said control voltage.

26. A voltage-controlled circuit according to claim 25, wherein said first potential source means includes a plurality of series-connected diodes which are forwardly biased by said first current to provide said first potential; and said second potential source means includes a plurality of series-connected diodes which are forwardly biased by said second current to provide said second potential.

27. A voltage-controlled circuit according to claim 26, wherein the ratio of said first current versus said second current substantially has a linear function with respect to said control voltage.

28. A voltage-controlled circuit according to claim 24, wherein said first potential source means includes a plurality of series-connected diodes which are forwardly biased by said first current to provide said first potential; and said second potential source means includes a plurality of series-connected diodes which are forwardly biased by said second current to provide said second potential.

29. A voltage-controlled circuit according to claim 28, wherein the ratio of said first current versus said second current substantially has a linear function with respect to said control voltage.

30. A voltage-controlled circuit according to claim 24, wherein said second current source means includes:
- a second current source transistor whose emitter is coupled via a second emitter resistor to said first circuit, whose collector is coupled via said second potential source means to said second circuit and whose base is coupled to the base of said first current source transistor.

31. A voltage-controlled circuit according to claim 30, wherein said first current feeding circuit includes a diode forwardly biased by a current flowing through said second current feeding circuit;

and said second current feeding circuit includes a diode forwardly biased by a current flowing through said first current feeding circuit.

* * * * *